United States Patent
Yu et al.

(10) Patent No.: US 9,466,694 B2
(45) Date of Patent: Oct. 11, 2016

(54) METAL-OXIDE-SEMICONDUCTOR TRANSISTOR DEVICE AND MANUFACTURING METHOD THEREOF

(71) Applicant: UNITED MICROELECTRONICS CORP., Hsin-Chu (TW)

(72) Inventors: Kun-Huang Yu, New Taipei (TW); Shih-Yin Hsiao, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/132,256

(22) Filed: Apr. 19, 2016

(65) Prior Publication Data

US 2016/0233313 A1 Aug. 11, 2016

Related U.S. Application Data

(62) Division of application No. 14/519,153, filed on Oct. 21, 2014, now Pat. No. 9,349,818.

(51) Int. Cl.

| | |
|---|---|
| H01L 29/78 | (2006.01) |
| H01L 21/768 | (2006.01) |
| H01L 29/66 | (2006.01) |
| H01L 29/40 | (2006.01) |
| H01L 29/423 | (2006.01) |
| H01L 29/06 | (2006.01) |

(52) U.S. Cl.
CPC ..... *H01L 29/66545* (2013.01); *H01L 29/0653* (2013.01); *H01L 29/401* (2013.01); *H01L 29/4238* (2013.01); *H01L 29/66568* (2013.01); *H01L 29/66659* (2013.01); *H01L 29/66681* (2013.01); *H01L 29/7816* (2013.01); *H01L 29/7833* (2013.01); *H01L 21/76895* (2013.01)

(58) Field of Classification Search
CPC ............... H01L 29/0653; H01L 29/66545; H01L 29/7833; H01L 29/4238; H01L 29/66659; H01L 29/66681; H01L 29/7835; H01L 29/7816; H01L 21/76895; H01L 23/522

See application file for complete search history.

(56) References Cited

U.S. PATENT DOCUMENTS

| | | | |
|---|---|---|---|
| 5,441,915 A * | 8/1995 | Lee | H01L 21/31053 257/211 |
| 6,069,076 A | 5/2000 | Takahashi | |
| 6,121,078 A * | 9/2000 | DeBrosse | H01L 21/76224 257/E21.546 |
| 6,246,119 B1 | 6/2001 | Wu | |
| 6,664,642 B2 | 12/2003 | Koubuchi | |
| 7,687,914 B2 | 3/2010 | Kuroda | |
| 7,737,020 B1 | 6/2010 | Ho | |
| 8,278,699 B2 | 10/2012 | Tanaka | |
| 2007/0114603 A1* | 5/2007 | Inagaki | H01L 21/28123 257/332 |
| 2011/0294292 A1* | 12/2011 | Adetutu | H01L 21/76807 438/675 |
| 2012/0098073 A1* | 4/2012 | Yu | H01L 21/76802 257/413 |

* cited by examiner

*Primary Examiner* — Michael Trinh
(74) *Attorney, Agent, or Firm* — Winston Hsu; Scott Margo (57) ABSTRACT

A method for manufacturing a MOS transistor device includes following steps. A substrate including at least an isolation structure formed therein is provided. Next, a MOS transistor device is formed on the substrate, the MOS transistor device includes a gate, a source region, a drain region and a spacer. After forming the MOS transistor device, at least a first dummy contact is formed on a drain side of the gate and a gate contact is formed to be electrically connected to the gate. The first dummy contact is spaced apart from a surface of the substrate and electrically connected to the gate contact.

8 Claims, 6 Drawing Sheets

METAL-OXIDE-SEMICONDUCTOR TRANSISTOR DEVICE AND MANUFACTURING METHOD THEREOF

CROSS REFERENCE TO RELATED APPLICATIONS

This application is a division of U.S. application Ser. No. 14/519,153 filed on Oct. 21, 2014, U.S. Pat. No. 9,349,818, and incorporated herein by reference in its entirety.

BACKGROUND OF THE INVENTION

1. Field of the Invention

The invention relates to a metal-oxide-semiconductor (hereinafter abbreviated as MOS) transistor device, and more particularly, to a high voltage metal-oxide-semiconductor (herein after abbreviated as HV MOS) transistor device.

2. Description of the Prior Art

Integrated circuits (IC) technologies not only progressed in feature size and integration density but also in integrating various MOS transistor devices into one chip (or die). For example, in system-on-chip (SOC) technologies, different types of microelectronic devices such as logic devices, analog devices, memory arrays, and high voltage devices may be integrated into one semiconductor wafer aimed for improving circuit performance, reliability, manufacturing cycle time, cost, device speed, and other advantages. In other exemplar, HV MOS transistor devices and mixed-signal circuit may be combined together for various applications.

HV MOS transistor device typically uses well implants to create the source, drain and drift regions while the essential feature of HV MOS transistor device is the lateral-diffused drift region with low dopant concentration and large area that is used to alleviate the high voltage between the drain and the source. For working in the high voltage condition, it is known that the breakdown voltage (BVD) and reliability are key factors for the HV MOS transistor device, and thus improvements to BVD and device reliability are always in need.

SUMMARY OF THE INVENTION

According to the claimed invention, a MOS transistor device is provided. The MOS transistor device includes a substrate including a gate formed thereon, and a spacer being formed on a sidewall of the gate; a source region and a drain region formed in the substrate; and at least a first dummy contact formed above the substrate on a drain side of the gate. More important, the first dummy contact is spaced apart from a surface of the substrate.

According to the claimed invention, a method for manufacturing a MOS transistor device is provided. According to the method, a substrate including at least an isolation structure formed therein is provided. Next, a MOS transistor device is formed on the substrate, the MOS transistor device includes a gate, a source region, a drain region and a spacer. After forming the MOS transistor device, at least a first dummy contact is formed on a drain side of the gate. The first dummy contact is spaced apart from a surface of the substrate.

According to the MOS transistor device and manufacturing method thereof provided by the present invention, the first dummy contact is formed on the drain side of the gate. More important, the first dummy contact is formed above and spaced apart from the surface of the substrate. That is, the first dummy contact never contacts the surface of the substrate. It is observed that by positioning the first dummy contact on the drain side of the gate, electrical fields are adjusted and pushed away from the gate. Accordingly, linear drain current (Idl) degradation is reduced, and both BVD and reliability are improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a method for manufacturing a HV MOS transistor device provided by a first preferred embodiment of the present invention, wherein FIG. 2 is a schematic drawing in a step subsequent to FIG. 1, and FIG. 3 is a schematic drawing in a step subsequent to FIG. 2.

FIGS. 3 and 5-6 are schematic drawings illustrating a method for manufacturing a HV MOS transistor device provided by a second preferred embodiment of the present invention, wherein FIG. 6 is a schematic drawing in a step subsequent to FIG. 5, and FIG. 3 is a schematic drawing in a step subsequent to FIG. 6.

FIGS. 3 and 7-8 are schematic drawings illustrating a method for manufacturing a HV MOS transistor device provided by a third preferred embodiment of the present invention, wherein FIG. 8 is a schematic drawing in a step subsequent to FIG. 7; and FIG. 3 is a schematic drawing in a step subsequent to FIG. 8.

DETAILED DESCRIPTION

Figure 1:
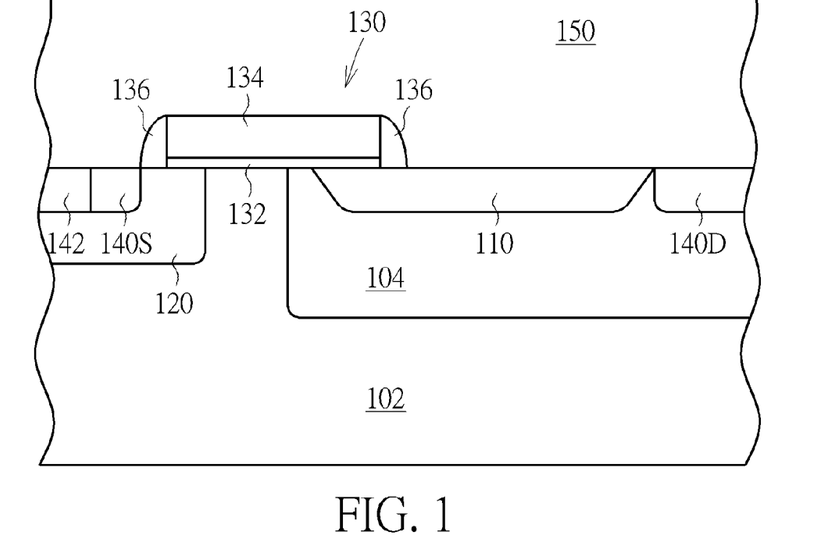
Figure 2:
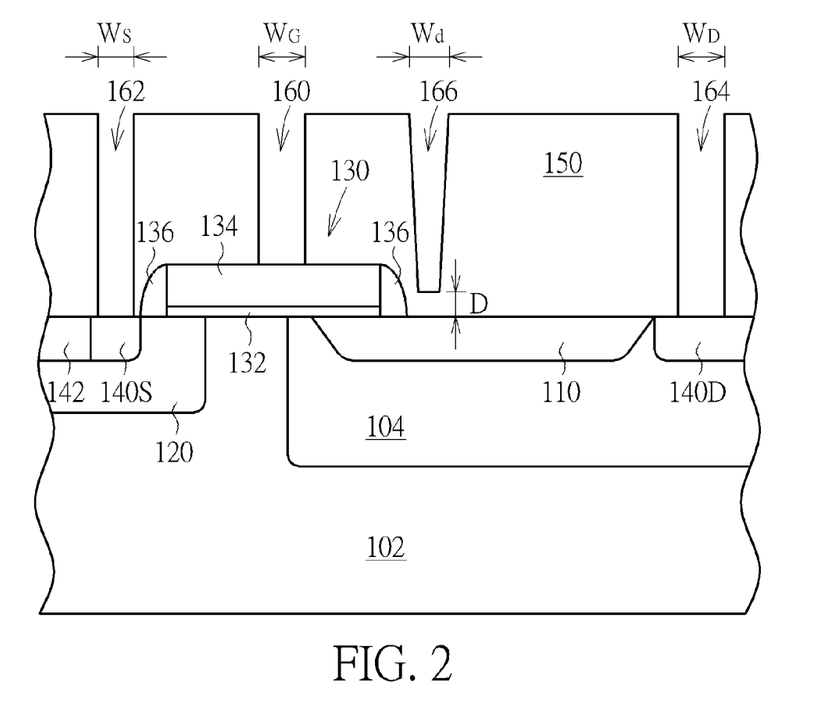
Figure 3:
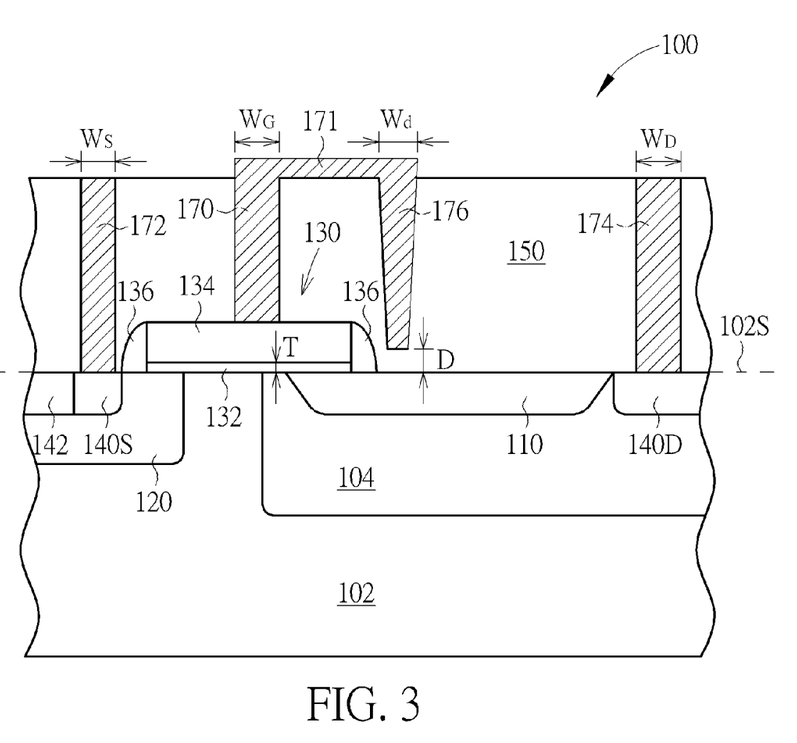

Please refer to FIGS. 1-3, which are schematic drawings illustrating a method for manufacturing a HV MOS transistor device provided by a first preferred embodiment of the present invention. As shown in FIG. 1, a substrate 102, such as a silicon substrate, is provided. A deep well 104 is formed in the substrate 102. The deep well 104 includes a first conductivity type while the substrate 102 includes a second conductivity type. The first conductivity type and the second conductivity type are complementary to each other. In the preferred embodiment, the first conductivity type is an n type and the second conductivity type is a p type. However those skilled in the art should easily realize that it can be vice versa. Accordingly, the preferred embodiment provides a p-substrate 102 and an n-deep well 104. Then, a pad oxide layer (not shown) and a patterned hard mask (not shown) for defining placement and size of a plurality of isolation structures are sequentially formed on the substrate 102. Next, the pad oxide layer and substrate 102 are etched with the patterned hard mask serving as an etching mask. Consequently, a plurality of shallow trenches (not shown) are formed in the substrate 102.

Please still refer to FIG. 1. After forming the shallow trenches, an insulating material is formed to fill up the shallow trenches and followed by performing a planarization process. Consequently, superfluous insulating material and the pad oxide layer are removed and a plurality of STIs are formed in the substrate 102. Additionally, surfaces of the STIs are coplanar with a surface 102S of the substrate 102 in the preferred embodiment, but not limited to this. Some of the STIs are used to provide electrical isolation between the devices and at least one STI is formed in the deep well 104 as shown in FIG. 1. It should be noted that though the STI are used as an isolation structure 110 in the preferred embodiment, those skilled in the art would easily realized that field oxide (FOX) structures can be adopted as the isolation structure in a modification to the preferred embodiment.

Please still refer to FIG. 1. After forming the isolations structure 110, a well region 120 is formed in the substrate 102. The well region 120 includes the second conductivity type and serves as a p-base region in the preferred embodiment. Next, a gate dielectric layer 132 and a gate conductive layer 134 such as a polysilicon layer are sequentially formed on the substrate 102. The gate conductive layer 134 and the gate dielectric layer 132 are then patterned, and thus a gate 130 is formed on the substrate 102 as shown in FIG. 1. A spacer 136 is subsequently formed on sidewalls of the gate 130. It is noteworthy that the gate 130 covers a portion of the isolation structure 110 in the preferred embodiment. Next, a drain region 140D, a source region 140S, and a doped region 142 are formed in the substrate 102. As shown in FIG. 1, the drain region 140D is formed in the deep well 104 while the source region 140S and the doped region 142 are formed in the well region 120. Furthermore, the source region 140S and the doped region 142 abut upon each other. According to the preferred embodiment, the drain region 140D and the source region 140S both include the first conductivity type and the doped region 142 includes the second conductivity type. Therefore, the preferred embodiment provides an n-drain region 140D, an n-source region 140S, and a p-doped region 142. More important, the drain region 140D is spaced apart from the gate 130 by the isolation structure 110 as shown in FIG. 1. Then, an insulating material 150 is formed on the substrate 102. The insulating material 150 serves as an interlayer dielectric (ILD) layer according to the preferred embodiment.

Please refer to FIG. 2. Next, an etching process is performed to etch the insulating material 150 and thus to simultaneously form a gate contact hole 160, a source contact hole 162, a drain contact hole 164, and a dummy contact hole 166 in the insulating material 150. The gate contact hole 160 is aligned with the gate 130, the source contact hole 162 is aligned with the source region 140S and the drain contact hole 164 is aligned with the drain region 140D. Furthermore, the dummy contact hole 166 is formed on a drain side of the gate 130, and is between the spacer 136 on the drain side and the drain region 140D. More preferably, the dummy contact hole 166 is formed next to the spacer 136 as shown in FIG. 2. It is noteworthy that a width Wd of the dummy contact hole 166 is smaller than a width WG of the gate contact hole 160, a width WS of the source contact hole 162 and a width WD of the drain contact hole 164. The etching process stops when the source region 140S, the gate conductive layer 134 and the drain region 140D are respectively exposed at a bottom of the source contact hole 162, a bottom of the gate contact hole 160 and a bottom of the drain contact hole 164. More important, because the width Wd of the dummy contact hole 166 is smaller than the widths WG/WS/WD of the gate contact hole 160, the source contact hole 162 and the drain contact hole 164, the etching to the insulating material 150 in the dummy contact hole 166 is not completed when it is stopped. Therefore the insulating material 150 is exposed at a bottom of the dummy contact hole 166 as shown in FIG. 2. In other words, the isolation structure 110 is not exposed. Additionally, the widths WG/WS/WD of the gate contact hole 160, the source contact hole 162 and the drain contact 164 can be identical to or different from each other, depending on different process or product requirements.

Please refer to FIG. 3. Then, a barrier layer is formed in the gate contact hole 160, the source contact hole 162, the drain contact hole 164 and the dummy contact hole 166 and following by filling up the gate contact hole 160, the source contact hole 162, the drain contact hole 164 and the dummy contact hole 166 with a conductive material. The conductive material includes, for example but not limited to, tungsten (W), aluminum (Al), copper (Cu). The superfluous conductive material is removed by a planarization process and thus a gate contact 170, a source contact 172, a drain contact 174 and a dummy contact 176 are obtained as shown in FIG. 3. Additionally, salicide layers can be formed before forming the insulating material 150. Or post-salicide process can be performed to form salicide layers after forming the insulating material 150 but before forming the contacts 170/172/174/176. As shown in FIG. 3, the gate contact 170 is electrically connected to the gate 130, the source contact 172 is electrically connected to the source region 140S, and the drain region 174 is electrically connected to the drain region 140D. More important, a wire 171 is formed to construct an electrical connection between the gate contact 170 and the dummy contact 176. Therefore the gate contact 170 is not only electrically connected to the gate 130, but also to the dummy contact 176 by the wire 171.

Please refer to FIG. 3 again. Consequently, a MOS transistor device 100, more particularly, a HV MOS transistor device 100 is obtained. The HV MOS transistor device 100 includes the dummy contact 176 electrically connected to the gate contact 170. More important, the dummy contact 176 is formed on the drain side of the gate 130 and above the surface 102S of the substrate 102. Specifically, the dummy contact 176 is formed between the spacer 136 and the drain region 140D, preferably next to the spacer 136. And the dummy contact 176 is spaced apart from the surface 102S of the substrate 102. It is noteworthy that since the preferred embodiment provides a HV MOS transistor device 100 of which the gate 130 covers a portion the isolation structure 110, the dummy contact 176 of the preferred embodiment is particularly formed above and spaced apart from the isolation structure 110 by the insulating material 150 as shown in FIG. 3. And a distance "D" between a bottom of the dummy contact 176 and the surface 102S of the substrate/a surface of the isolation structure 110 is 4-7 times of a thickness "T" of the gate dielectric layer 132.

Figure 4:
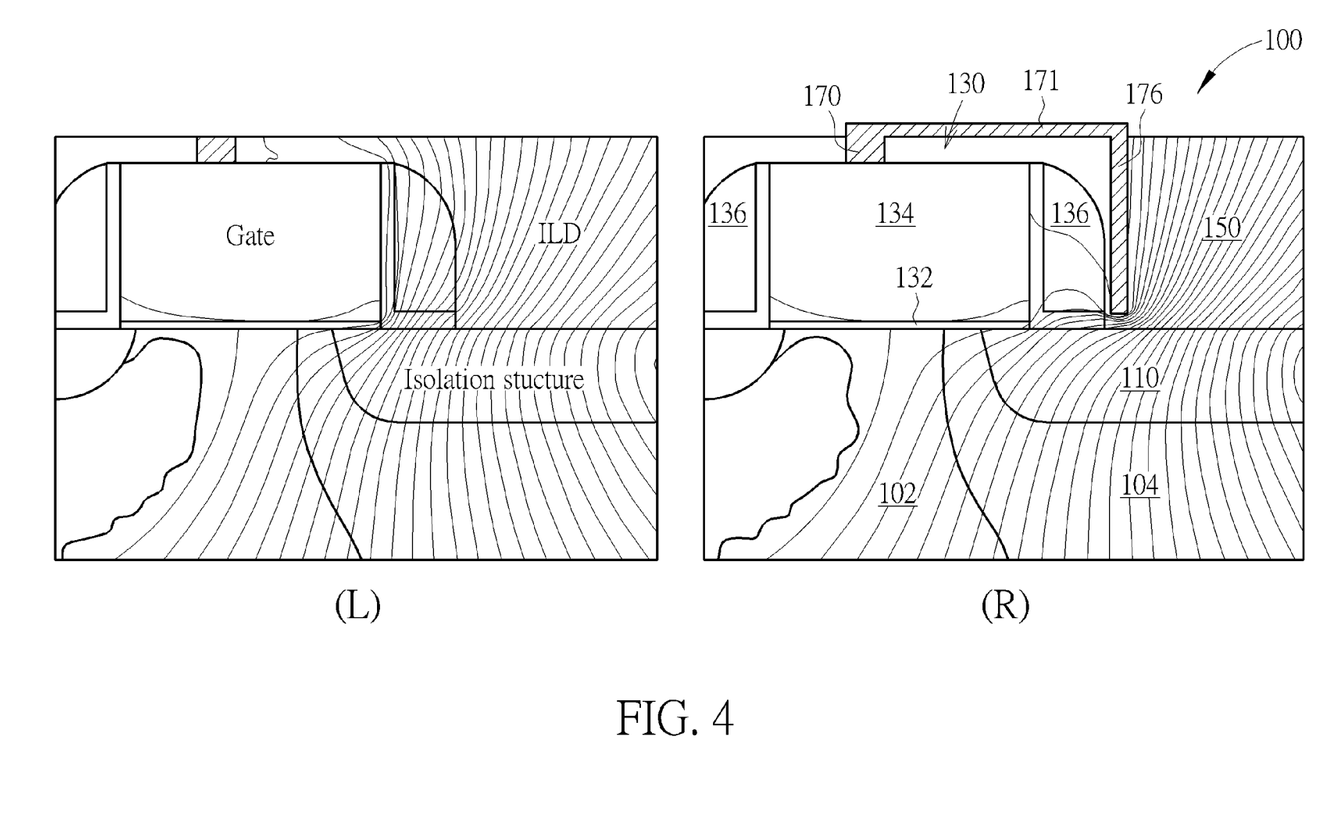
FIG. 4 is a schematic drawing illustration a comparison between the HV MOS transistor device provided by the preferred embodiment and a conventional HV MOS transistor device.

Please refer to FIG. 4, which is a schematic drawing illustration a comparison between the HV MOS transistor device provided by the preferred embodiment and a conventional HV MOS transistor device. More specifically, a conventional HV MOS transistor device is depicted on the left side (L) of FIG. 4 and the MOS transistor device provided by the preferred embodiment is depicted on the right side (R) of FIG. 4. As shown in the left side (L) of FIG. 4, electric lines are gathered up at a bottom corner of the gate on the drain side in the conventional HV MOS transistor device. Different from the conventional HV MOS transistor device, electric lines are gathered up at the bottom of the dummy contact 176 of the HV MOS transistor device 100 provided by the preferred embodiment. It is therefore observed that electrical fields are pushed away from the gate 130 due to the placement of the dummy contact 176. Consequently, linear drain current (Idl) degradation is reduced from 9.88% to 8.76%, and BVD and reliability are improved.

Figure 5:
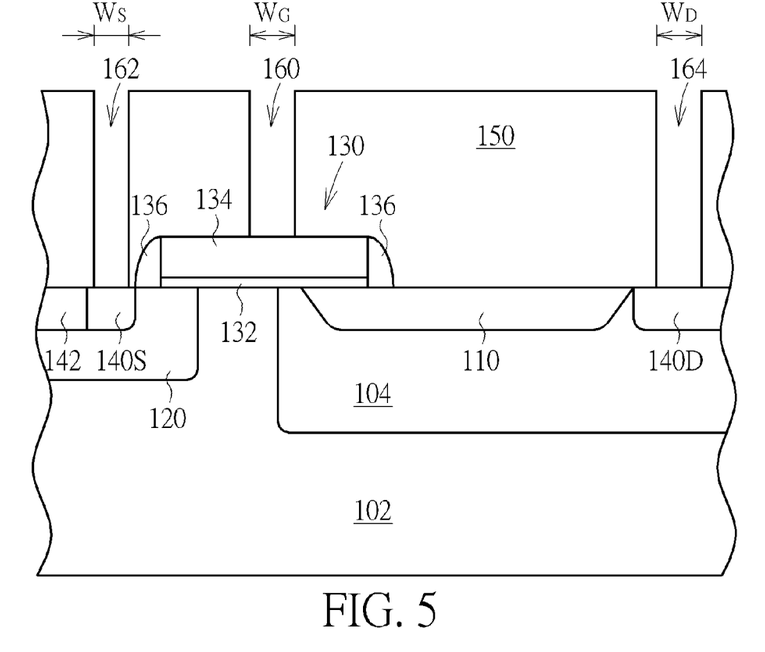
Figure 6:
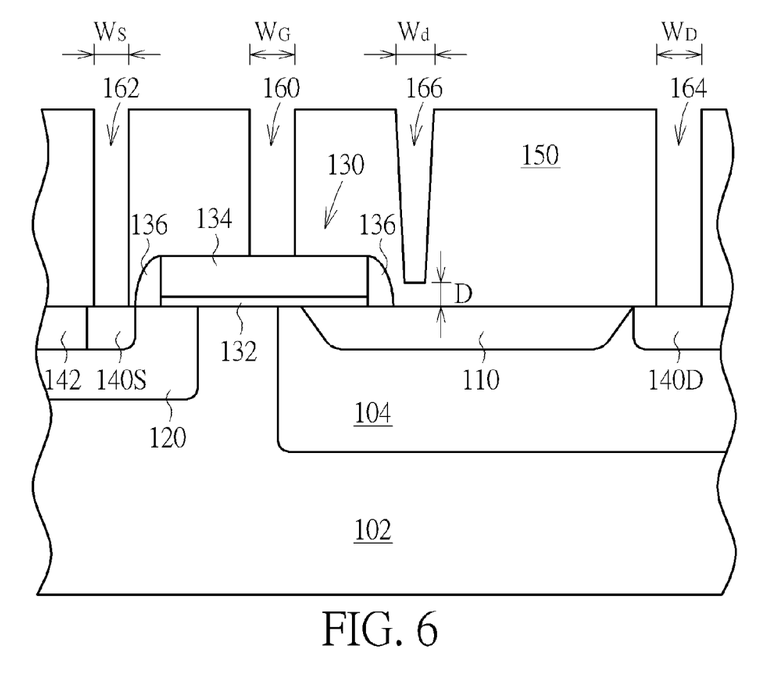

Please refer to FIGS. 3 and 5-6, which are schematic drawings illustrating a method for manufacturing a HV MOS transistor device provided by a second preferred embodiment of the present invention. It should be noted that elements the same in the first and second preferred embodiments are designated by the same numerals and those details are omitted hereinafter in the interest of brevity. As shown in FIG. 5, the preferred embodiment provides a substrate 102 including a deep well 104 formed therein, and an isolation structure 110 is formed in the substrate 102, a well region 120 is then formed in the substrate 102. The deep well 104 includes a first conductivity type, and the substrate 102 and the well region 120 include a second conductivity type. The first conductivity type and the second conductivity type are complementary to each other. In the preferred embodiment, the first conductivity type is an n type and the second conductivity type is a p type. However those skilled in the art should easily realize that it can be vice versa. Next, a gate 130 including a gate dielectric layer 132 and a gate conductive layer 134 is formed on the substrate 102 and followed by forming a spacer 136 on its sidewall. A drain region 140D including the first conductivity type, a source region 140S including the first conductivity type, and a doped region 142 including the conductivity type are formed in the substrate 102. As shown in FIG. 1, the drain region 140D is formed in the deep well 104 while the source region 140S and the doped region 142 are formed in the well region 120. Then, an insulating material 150 serving as an ILD layer is formed on the substrate 102.

Please still refer to FIG. 5. An etching process is then performed to etch the insulating material 150 and thus to form a gate contact hole 160, a source contact hole 162 and a drain contact hole 164 in the insulating material 150. The gate contact hole 160 is aligned with the gate 130, and the gate 130 is exposed at a bottom of the gate contact hole 160. The source contact hole 162 is aligned with the source region 140S, and the source region 140S is exposed at a bottom of the source contact hole 162. The drain contact hole 164 is aligned with the drain region 140D, and the drain region 140D is exposed at a bottom of the drain contact hole 164. The gate contact hole 160 includes a width WG, the source contact hole 162 includes a width WS, and the drain contact hole 164 includes a width WD. In the preferred embodiment, the widths WG/WS/WD of the gate contact hole 160, the source contact hole 162 and the drain contact hole 164 are identical to each other, but those skilled in the art would easily realize that those widths can be different from each other, depending on different process or product requirements.

Please refer to FIG. 6. After forming the gate contact hole 160, the source contact hole 162, and the drain contact hole 164, another etching process is performed to form a dummy contact hole 166 in the insulating material 150. In the preferred embodiment, the dummy contact hole 166 includes a width Wd, and the width Wd is substantially equal to the widths WG/WS/WD of the gate contact hole 160, the source contact hole 162 and the drain contact hole 164. Furthermore, the dummy contact hole 166 is formed on a drain side of the gate 130, and is between the spacer 136 and the drain region 140D. More preferably, the dummy contact hole 166 is formed next to the spacer 136 as shown in FIG. 6. It is noteworthy that the insulating material 150 is exposed at a bottom of the dummy contact hole 166 as shown in FIG. 6. In other words, the isolation structure 110 is not exposed.

Please refer back to FIG. 3. After forming the dummy contact hole 166, the gate contact hole 160, the source contact hole 162, the drain contact hole 164 and the dummy contact hole 166 are filled up with a conductive material. And the superfluous conductive material is removed by a planarization process and thus a gate contact 170, a source contact 172, a drain contact 174 and a dummy contact 176 are obtained as shown in FIG. 3. The gate contact 170 is electrically connected to the gate 130, the source contact 172 is electrically connected to the source region 140S, and the drain region 174 is electrically connected to the drain region 140D. More important, a wire 171 is formed to construct an electrical connection between the gate contact 170 and the dummy contact 176. Therefore the gate contact 170 is not only electrically connected to the gate 130, but also to the dummy contact 176 by the wire 171. It should be easily understood that the placement of the dummy contact 176 in the second preferred embodiment is the same with that in the first preferred embodiment except that the width Wd of the dummy contact 176 is smaller than the widths WG/WS/WD of the gate contact 170, the source contact 172 and the drain contact 174 in the first preferred embodiment while the above mentioned widths Wd, WG, WS, and WD can be equal to each other in the second preferred embodiment.

Figure 7:
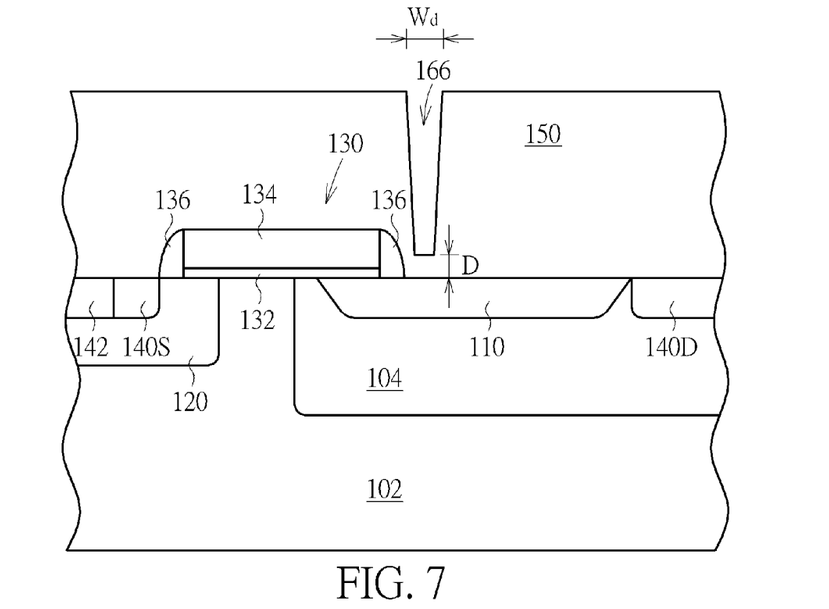
Figure 8:
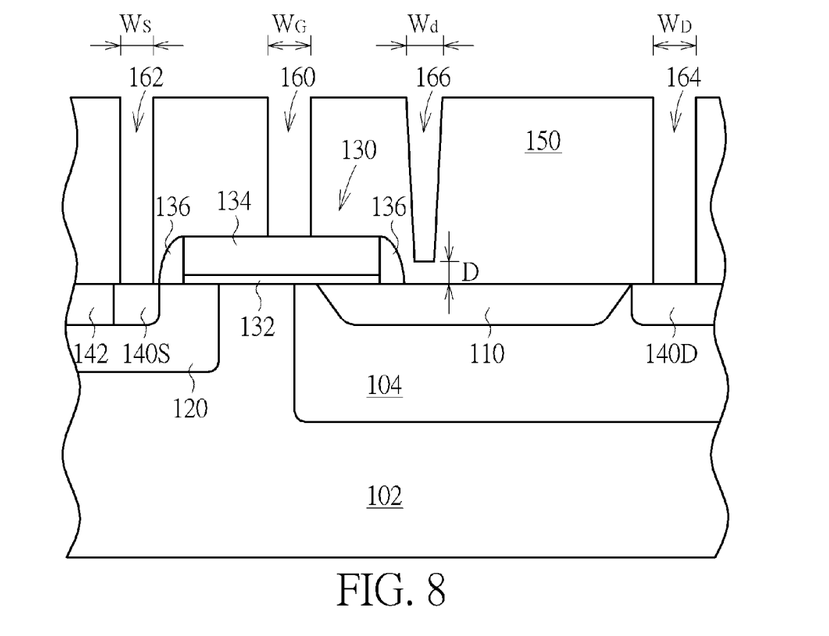

Please refer to FIGS. 3 and 7-8, which are schematic drawings illustrating a method for manufacturing a HV MOS transistor device provided by a third preferred embodiment of the present invention. It should be noted that elements the same in the second and third preferred embodiments are designated by the same numerals. Furthermore, those details are omitted hereinafter in the interest of brevity and only the differences between the second and third preferred embodiments are detailed. The difference between the second and third preferred embodiment is: the dummy contact hole 166 is formed after forming the gate contact hole 160, the source contact hole 162 and the drain contact hole 164 as shown in FIGS. 5-6 of the second preferred embodiment, while the dummy contact hole 166 is formed before forming the gate contact hole 160, the source contact hole 162 and the drain contact hole 164 as shown in FIGS. 7-8 of the third preferred embodiment.

Please refer back to FIG. 3. After forming the gate contact hole 160, the source contact hole 162 and the drain contact hole 164, the dummy contact hole 166, the gate contact hole 160, the source contact hole 162, the drain contact hole 164 are filled up with a conductive material. And the superfluous conductive material is removed by a planarization process and thus a gate contact 170, a source contact 172, a drain contact 174 and a dummy contact 176 are obtained as shown in FIG. 3. The gate contact 170 is electrically connected to the gate 130, the source contact 172 is electrically connected to the source region 140S, and the drain region 174 is electrically connected to the drain region 140D. More important, a wire 171 is formed to construct an electrical connection between the gate contact 170 and the dummy contact 176. Therefore the gate contact 170 is not only electrically connected to the gate 130, but also to the dummy contact 176 by the wire 171. As mentioned above, the placement of the dummy contact 176 in the third preferred embodiment is the same with that in the first preferred embodiment except that the width Wd of the dummy contact 176 is smaller than the widths WG/WS/WD of the gate contact 170, the source contact 172 and the drain contact 174 in the first preferred embodiment while the above mentioned widths Wd, WG, WS, and WD can be equal to each other in the third preferred embodiment.

As mentioned above, a MOS transistor device 100, more particularly, a HV MOS transistor device 100 is obtained. The HV MOS transistor device 100 includes a dummy contact 176 electrically connected to the gate contact 170. More important, the dummy contact 176 is formed on the drain side of the gate 130 and above a surface 102S of the substrate 102. As shown in FIG. 3, the dummy contact 176 is spaced apart from the surface 102S of the substrate 102. It is noteworthy that since the preferred embodiment provides a HV MOS transistor device 100 of which the gate 130 covers a portion the isolation structure 110, the dummy contact 176 of the second and third preferred embodiments is particularly formed above and spaced apart from the isolation structure 110 by the insulating material as shown in FIG. 3. And a distance "D" between a bottom of the dummy contact 176 and the surface 102S of the substrate/a surface of the isolation structure 110 is 4-7 times of a thickness "T" of the gate dielectric layer 132.

Figure 9:
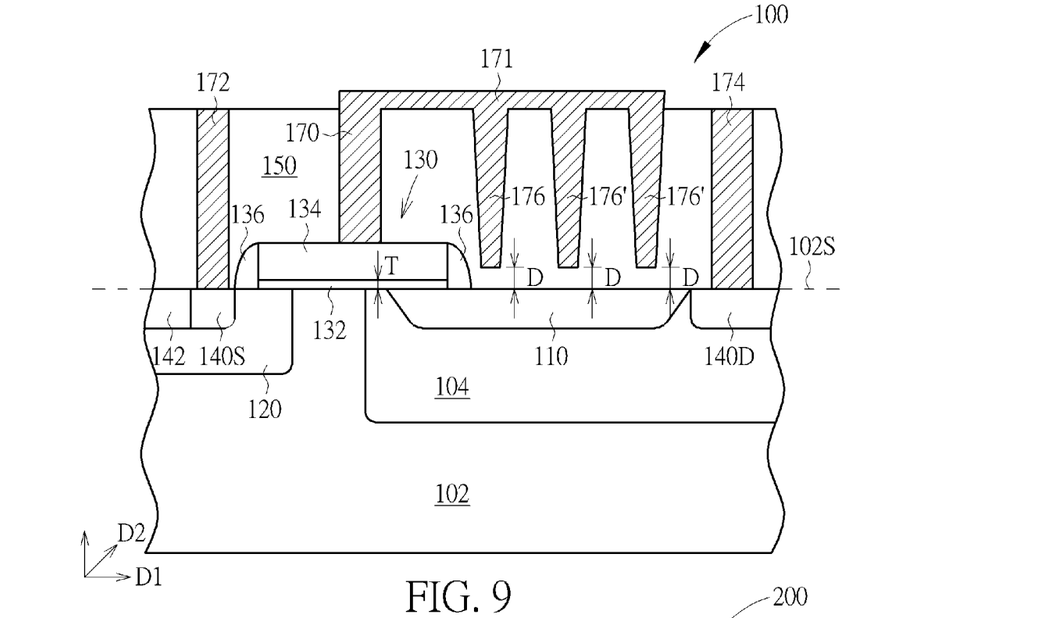
FIG. 9 is a schematic drawing illustrating a modification to the first to third preferred embodiments of the present invention.

Please refer to FIG. 9, which is a modification to the first to third preferred embodiments provided by the present invention. It should be noted that elements the same in the first to third preferred embodiments and the instant modification are designated by the same numerals. Furthermore, those details are omitted hereinafter in the interest of brevity and only the differences between the second and third preferred embodiments are detailed: According to the modification, the HV MOS transistor device 100 includes a plurality of dummy contacts 176 and 176' all simultaneously formed. As shown in FIG. 9, the dummy contacts 176 and 176' are all formed between the spacer 136 on the drain side and the drain region 140D. At least one of the dummy contacts is formed next to the spacer 136, and that dummy contact is emphasized by 176 while other dummy contacts are designated by 176' as shown in FIG. 9. More important, the dummy contacts 176/176' are all spaced apart from the surface 102S of the substrate 102. In the modification which adopts HV MOS technique, the dummy contacts 176/176' are all formed above the isolation structure 110 and spaced apart from the isolation structure 110 by the insulating material 150. Also a distance "D" between bottoms of the dummy contacts 176/176' and the surface 102S of the substrate/a surface of the isolation structure 110 is 4-7 times of a thickness "T" of the gate dielectric layer 132. Furthermore, the dummy contacts 176/176' are all electrically connected to the gate contact 170. Additionally, an amount of the dummy contacts 176 can be adjusted to fit the needs. It should be noted that the dummy contacts 176/176' are arranged along a first direction D1 as shown in FIG. 9, however those skilled in the art would easily realize that the dummy contacts 176/176' can also be arranged in a second direction D2 that is perpendicular to the first direction D1 as shown in FIG. 9.

It is noteworthy that the dummy contacts 176 and 176' are all formed between the spacer 136 on the drain side and the drain region 140D. Accordingly, electric lines are gathered up at a bottom of the dummy contact 176' proximal to the drain region 140D. It is therefore observed that electrical fields are further pushed away from the gate 130 due to the placement of the dummy contacts 176 and 176'. Consequently, linear drain current degradation is reduced and both BVD and reliability are improved.

Figure 10:
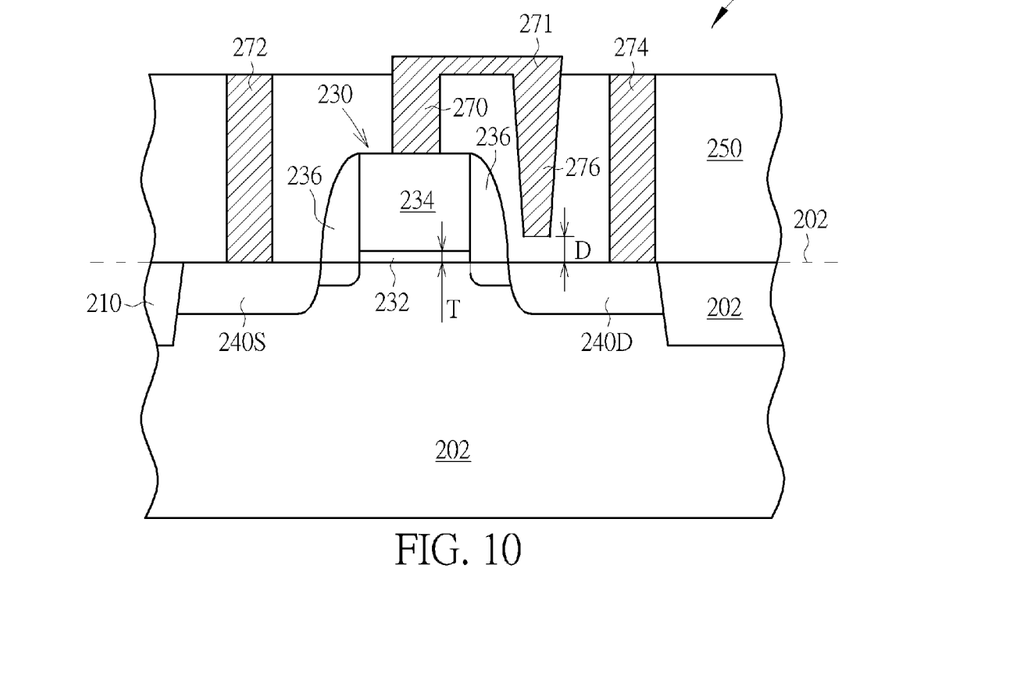
FIG. 10 is a schematic drawing illustrating a fourth preferred embodiment of the present invention.

Please refer to FIG. 10, which is a schematic drawing illustrating a fourth preferred embodiment of the present invention. The preferred embodiment provides a substrate 202 including a deep well (not shown) formed therein, and a plurality of isolation structures 210 for providing electrical isolation are formed in the substrate 202. Next, a gate 230 including a gate dielectric layer 232 and a gate conductive layer 234 is formed on the substrate 202 and followed by forming a spacer 236 on its sidewall. A drain region 240D and a source region 240S including the first conductivity type are formed in the substrate 102. Then, an insulating material 250 serving as the ILD layer is formed on the substrate 202.

Please still refer to FIG. 10. An etching process is then performed to form a gate contact hole (not shown), a source contact hole (not shown), a drain contact hole (not shown), and a dummy contact hole (not shown) in the insulating material 250. It should be easily realized that the dummy contact hole can be formed simultaneously with forming the gate contact hole, the source contact hole and the drain contact hole as mentioned in the first preferred embodiment, it can be also formed before or after forming the gate contact hole, the source contact hole and the drain contact hole as respectively mentioned in the second and third preferred embodiments. When the dummy contact hole is formed simultaneously with forming the gate contact hole, the source contact hole and the drain contact hole, a width of the dummy contact hole is smaller than widths of the gate contact hole, the source contact hole and the drain contact hole. When dummy contact hole is formed before or after forming the gate contact hole, the source contact hole and the drain contact hole, the width of the dummy contact hole is equal to the widths of the gate contact hole, the source contact hole and the drain contact hole, but not limited to this. Furthermore, the dummy contact hole is formed on a drain side of the gate 230, and is between the spacer 236 and the drain region 240D. More preferably, the dummy contact hole is formed next to the spacer 236. It is noteworthy that the insulating material 250 is exposed at a bottom of the dummy contact hole. In other words, a surface 202S of the substrate 202 is not exposed.

Please still refer to FIG. 10. Next, the dummy contact hole, the gate contact hole, the source contact hole, the drain contact hole and the dummy contact hole are filled up with a conductive material. And the superfluous conductive material is removed by a planarization process and thus a gate contact 270, a source contact 272, a drain contact 274 and a dummy contact 276 are obtained as shown in FIG. 10. The gate contact 270 is electrically connected to the gate 230, the source contact 272 is electrically connected to the source region 240S, and the drain region 274 is electrically connected to the drain region 240D. More important, a wire 271 is formed to construct an electrical connection between the gate contact 270 and the dummy contact 276. Therefore the gate contact 270 is not only electrically connected to the gate 230, but also to the dummy contact 276 by the wire 271.

Accordingly, a MOS transistor device 200 is obtained. The MOS transistor device 200 includes the dummy contact 276 electrically connected to the gate contact 270. More important, the dummy contact 276 is formed on the drain side of the gate 230 and above a surface 202S of the substrate 202. As shown in FIG. 10, the dummy contact 276 is spaced apart from the surface 202S of the substrate 202 by the insulating material 250. And a distance "D" between a bottom of the dummy contact 276 and the surface 202S of the substrate 202 is 4-7 times of a thickness "T" of the gate dielectric layer 232. Additionally, the MOS transistor device 200 can include a plurality of dummy contacts 276 formed between the drain region 240D and the spacer 236 on the drain side and spaced apart from the surface 202S of the substrate 202 according to a modification to the preferred embodiment.

According to the MOS transistor device or HV MOS transistor device and manufacturing method thereof provided by the present invention, at least one dummy contact is formed on the drain side of the gate. More important, the dummy contact is formed above and spaced apart from the silicon surface of the substrate or from the insulating surface of the isolation structure. That is, the dummy contact never contacts the surface of the substrate or the surface of the isolation structure. It is observed that by positioning the dummy contact on the drain side of the gate, electrical fields are pushed away from the gate. Accordingly, linear drain current degradation is reduced and both BVD and reliability are improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a metal-oxide-semiconductor (MOS) transistor device, comprising:
    providing a substrate comprising at least an isolation structure formed therein;
    forming a metal-oxide-semiconductor (MOS) transistor device on the substrate, the MOS transistor device comprising a gate, a source region, a drain region and a spacer; and
    forming a first dummy contact on a drain side of the gate and a gate contact electrically connected to the gate, the first dummy contact being formed apart from a surface of the substrate and electrically connected to the gate contact.

2. The method for manufacturing the MOS transistor device according to claim 1, further comprising:
    forming an insulating material on the substrate;
    forming a gate contact hole, a source contact hole and a drain contact hole in the insulating material;
    forming a first dummy contact hole in the insulating material; and
    filling up the gate contact hole, the source contact hole, the drain contact hole and the first dummy contact hole with a conductive material to form the gate contact, a source contact electrically connected to the source region, a drain contact electrically connected to the drain region, and the first dummy contact.

3. The method for manufacturing the MOS transistor device according to claim 2, wherein the first dummy contact hole, the gate contact hole, the source contact hole, and the drain contact hole are formed simultaneously.

4. The method for manufacturing the MOS transistor device according to claim. 3, wherein a width of the first dummy contact hole is smaller than widths of the gate contact hole, the source contact hole and the drain contact hole.

5. The method for manufacturing the MOS transistor device according to claim 2, wherein the first dummy contact hole is formed after forming the gate contact hole, the source contact hole and the drain contact hole.

6. The method for manufacturing the MOS transistor device according to claim 2, wherein the first dummy contact hole is formed before forming the gate contact hole, the source contact hole and the drain contact hole.

7. The method for manufacturing the MOS transistor device according to claim 1, wherein the gate covers a portion of the isolation structure, the first dummy contact is formed above and spaced apart from the isolation structure.

8. The method for manufacturing the MOS transistor device according to claim 1, further comprising forming at least a second dummy contact above the substrate on the drain side of the gate simultaneously with forming the first dummy contact, and the second dummy contact is formed apart the surface of the substrate.

* * * * *